United States Patent [19]

Tsujimoto et al.

[11] Patent Number: 5,352,559
[45] Date of Patent: Oct. 4, 1994

[54] PHOTOSENSITIVE SHEET AND A METHOD FOR THE FORMATION OF IMAGES USING THE SAME

[75] Inventors: Yoshiharu Tsujimoto, Yamatokohriyama; Kunio Ohashi; Yoshikazu Fujiwara, both of Nara; Hiromu Sasaki; Syoichi Nagata, both of Yamatokohriyama, all of Japan

[73] Assignee: Sharp Kabushiki Kaisha, Osaka, Japan

[21] Appl. No.: 984,257

[22] Filed: Dec. 1, 1992

Related U.S. Application Data

[63] Continuation of Ser. No. 644,424, Jan. 22, 1991, abandoned, which is a continuation of Ser. No. 432,348, Nov. 6, 1989, abandoned, which is a continuation of Ser. No. 216,577, Jul. 8, 1988, abandoned.

[30] Foreign Application Priority Data

Jul. 10, 1987 [JP] Japan .................. 62-173706
Aug. 25, 1987 [JP] Japan .................. 62-210888

[51] Int. Cl.⁵ .................................. G03C 1/72
[52] U.S. Cl. ...................... 430/138; 430/211; 430/235; 430/270; 430/271; 430/275; 430/395; 430/915
[58] Field of Search ............. 430/138, 211, 235, 270, 430/271, 275, 915, 395

[56] References Cited

U.S. PATENT DOCUMENTS

| | | | |
|---|---|---|---|
| 3,219,446 | 11/1965 | Berman | 430/138 |
| 3,701,663 | 10/1972 | Kondo et al. | |
| 4,124,394 | 11/1978 | Sera et al. | 430/214 |
| 4,137,194 | 1/1979 | McCune, Jr. | 252/316 |
| 4,250,243 | 2/1981 | Yoshida et al. | 430/215 |
| 4,365,018 | 12/1982 | Crutchfield et al. | 430/139 |
| 4,379,833 | 4/1983 | Canavello et al. | 430/325 |
| 4,386,149 | 5/1983 | Mason et al. | 430/213 |
| 4,399,209 | 8/1983 | Sanders et al. | 430/138 |
| 4,481,277 | 11/1984 | Pfingston | 430/218 |
| 4,551,407 | 11/1985 | Sanders et al. | 430/138 |
| 4,639,127 | 1/1987 | Beery et al. | |
| 4,743,531 | 5/1988 | Farid et al. | 430/281 |
| 4,772,530 | 9/1988 | Gottschalk et al. | 430/138 |
| 4,910,117 | 3/1990 | Dowler et al. | 430/158 |

FOREIGN PATENT DOCUMENTS

| | | |
|---|---|---|
| 257574 | 3/1988 | European Pat. Off. |
| 298781 | 1/1989 | European Pat. Off. |
| 59-149343 | 8/1984 | Japan |
| 62-222240 | 9/1987 | Japan |
| 2113860 | 8/1983 | United Kingdom |

OTHER PUBLICATIONS

R. F. Antonucci et al., IBM Technical Disclosure Bulletin, vol. 24, No. 6, Nov. 1981, p. 2679.

*Primary Examiner*—Marion E. McCamish
*Assistant Examiner*—Mark A. Chapman
*Attorney, Agent, or Firm*—Spencer, Frank & Schneider

[57] ABSTRACT

A photosensitive sheet comprising a sheet-shaped substrate, one surface of which is coated with a light-reflective substance or which is made of a light-reflective substance, and pressure-rupturable capsules that coat the light-reflective surface of the substrate or the other surface of the substrate, the pressure-rupturable capsules containing chromogenic materials and photosensitive materials that are hardened when illustrated with light, and a method for the formation of images using the said photosensitive sheet.

2 Claims, 6 Drawing Sheets

PHOTOSENSITIVE SHEET AND A METHOD FOR THE FORMATION OF IMAGES USING THE SAME

This application is a continuation application Ser. No. 07/644,424, filed Jan. 22, 1991 now abandoned, which is a continuation of application Ser. No. 07/432,348, filed Nov. 6, 1989 now abandoned, which is a continuation of application Ser. No. 07/216,577, filed Jul. 8, 1988 now abandoned.

BACKGROUND OF THE INVENTION

1. Field of the Invention

This invention relates to a photosensitive sheet that comprises a light-reflective substrate in the shape of a sheet coated with pressure-rupturable capsules containing a chromogenic material and a photosensitive material, and to a method for the formation of images using the said photosensitive sheet.

2. Description of the Prior Art

Japanese Laid-Open Patent Publications 58-88739 and 59-149343 disclose methods for the formation of images that make use of photosensitive sheets, which are composed of a light-permeable substrate in the shape of a sheet and pressure-rupturable capsules coated on the substrate. The capsules contain a specific chromogenic material and a photosensitive material.

When this kind of photosensitive sheet is exposed to light from or through a certain image, only the pressure-rupturable capsules that were exposed on the top of the photosensitive sheet harden, resulting in a latent image on the photosensitive sheet that corresponds to the image from or through which the sheet was exposed to light. When the photosensitive sheet on which a latent image is formed is brought together with an image-receiving sheet that is coated with developing materials that give rise to colors with the chromogenic material inside the pressure-rupturable capsules, the pressure-rupturable capsules that are still not hardened rupture, and the chromogenic material contained in these pressure-rupturable capsules flows out. Then there is a reaction between the chromogenic material and the developing materials of the image-receiving sheet, which gives rise to color in the said chromogenic material, which forms an image on the image-receiving sheet.

It is also possible to form colored images by the use of the above-mentioned photosensitive sheet. For example, three kinds of photosensitive materials hardened by light are used that are hardened by wavelengths in the red, green, or blue regions, and one of the three kinds of photosensitive materials and a chromogenic material that gives rise to a color complementary to that color of light are contained in the same pressure-rupturable capsules. In this way, three kinds of pressure-rupturable capsules are prepared. That is, a material that is hardened by light with wavelengths in the blue region of light and a chromogenic material that gives rise to yellow, the color complementary to blue, are contained in some pressure-rupturable capsules (called Y capsules below); a material that is hardened by light with wavelengths in the green region of light and a chromogenic material that gives rise to magenta, the color complementary to green (called M capsules below); and a material that is hardened by light with wavelengths in the red region of light and a chromogenic material that gives rise to cyan, the color complementary to red (called C capsules below ) are the three kinds of pressure-rupturable capsules prepared. Then, these three kinds of pressure-rupturable capsules are distributed evenly over the top of the light-permeable substrate in the shape of a sheet to give a coated photosensitive sheet. This photosensitive sheet, when it is exposed to light reflected from a manuscript that is illuminated with white light, has the photosensitive material in each of the pressure-rupturable capsules of the said photosensitive sheet harden in response to the amount of light of the various wavelengths of the light for exposure, resulting in the formation on the photosensitive sheet of a latent image that has color information. Then, the photosensitive sheet that has this kind of a latent image is put together with pressure with an image-receiving sheet coated with developing materials that give rise to specific colors when they react with the chromogenic materials in the different pressure-rupturable capsules. In this way, the pressure-rupturable capsules on the said photosensitive sheet that have photosensitive material that is still not hardened are ruptured, and the chromogenic material in the inside flows out, reacting with the developing materials of the image-receiving material, giving rise to a specific color. The result is that a color image is formed on the image-receiving sheet that corresponds to the color image of the manuscript.

In this way, in the method for the formation of color images by use of a photosensitive sheet coated evenly with three kinds of pressure-rupturable capsules on top of a light-permeable substrate, it is not necessary to decompose the color images of the manuscript into the wavelengths of the light (blue, green, and red) to which the photosensitive materials of the different pressure-rupturable capsules are sensitive. Therefore, this method for the formation of images can be used to form a latent image that corresponds to the color image of the manuscript on the photosensitive sheet with exposure to light that is merely white light reflected from the manuscript.

However, the photosensitive material contained in the pressure-rupturable capsules of the photosensitive sheet is relatively insensitive to light, and for that reason, by simple exposure of the photosensitive sheet to the image of the manuscript, there is a possibility that the specific photosensitive material will not harden. Moreover, if the amount of light used for exposure is small, there is a possibility that the time taken for hardening of the photosensitive material will be long. In order to decrease these possibilities, the increasing of the amount of light used to expose the photosensitive sheet has been tried. However, to do this, it is necessary to increase the scale of the light source, to lengthen the time of exposure, and so on. Also, if the amount of light used for exposure of the photosensitive sheet is increased, photosensitive material that should not be hardened may become hardened.

The photosensitive materials that are contained in the pressure-rupturable capsules that coat the photosensitive sheet have individual light-sensitivities depending on their variety. For this reason, it is extremely difficult to have equal sensitivity to the different wavelengths of light when the three kinds of photosensitive materials are hardened by three different wavelengths of light. Therefore, the pressure-rupturable capsules that contain photosensitive materials with poor light-sensitivity are hardened with difficulty, and when these pressure-rupturable capsules are ruptured when the photosensitive sheet and the image-receiving sheet are placed together with pressure, there is the danger that the chromogenic material on their insides will give rise to color. In this case, it will not be possible to reproduce the color image of the manuscript faithfully.

In order to solve these kinds of problems, a method for the exposure of photosensitive sheets has been proposed in which white light is used to illuminate the manuscript, and the amount of light that reflects from the said manuscript is calibrated by filters. As shown in FIG. 10, the photosensitive sheet 10 that is used in this method is constituted of a light-permeable substrate 11 made of polyester film or the like and three kinds of pressure-rupturable capsules 12 that give rise to three different colors. The pressure-rupturable capsules 12 include C capsules that contain a chromogenic material that gives rise to the color cyan at the time of development, M capsules that contain a chromogenic material that gives rise to the color magenta at the time of development, and Y capsules that contain a chromogenic material that gives rise to the color yellow at the time of development. The different kinds of capsules are evenly distributed so as to coat the top of the substrate 11. This photosensitive sheet 10 is placed on the top of a sheet-exposure stand, and a manuscript 6 is illuminated with white light, so that the light that is reflected from the said manuscript 6 passes through a filter 3, exposing the sheet and selectively hardening the different pressure-rupturable capsules 12 (the pressure-rupturable capsules that are hatched in the figure are hardened). This forms a latent image with color information on the photosensitive sheet 10. The filter 3 functions to calibrate the sensitivity of the three kinds of pressure-rupturable capsules. Each kind of pressure-rupturable capsule has its own sensitivity characteristics, as shown, for example, in FIG. 11, wherein the sensitivity of the C capsules is greater than the sensitivities of the Y capsules and the M capsules. Therefore, even if the amount of red light to which the C capsules are sensitive is small, the said C capsules will harden. For that reason, in order to make the sensitivity of the three kinds of pressure-rupturable capsules the same, a filter that absorbs the red light to which the C capsules are sensitive is used, and the amount of said red light is decreased, which is the same in effect as increasing the amount of light in the wavelengths to which the Y capsules and the M capsules are sensitive. In this way, the apparent shift of the characteristic curve of the C capsules shown in FIG. 11 to the right can be attained. By this principle, if proper absorbance characteristics of red light by the filter 3 are selected, then, as shown in FIG. 9, it is possible to make the sensitivity characteristics of each of the kinds of pressure-rupturable capsules apparently approximately equal.

However, in this method for the formation of an image in which the sensitivity of the pressure-rupturable capsules are calibrated by the use of the above-mentioned filter, because light is absorbed by the filter, the overall amount of light that is used for the exposure to light of the photosensitive sheet is decreased. For this reason, it is necessary to increase the overall amount of white light used to illuminate the manuscript, and thus, it is necessary both to increase the size of the light source and to lengthen the time of exposure.

SUMMARY OF THE INVENTION

The photosensitive sheet of this invention, which overcomes the above-discussed and numerous other disadvantages and deficiencies of the prior art, comprises a sheet-shaped substrate, one surface of which is coated with a light-reflective substance or which is made of a light-reflective substance, and pressure-rupturable capsules that coat said light-reflective surface of said substrate or the other surface of said substrate, said pressure-rupturable capsules containing chromogenic materials and photosensitive materials that are hardened when illustrated with light. The light-reflective substance has specific spectral reflectivity properties that correspond to the wavelengths of light to which any one of the photosensitive materials is photosensitive.

In a preferred embodiment, the photosensitive materials contained in said pressure-rupturable capsules are photosensitive to different wavelengths of light.

In a preferred embodiment, each of the chromogenic materials contained in said pressure-rupturable capsules gives rise to a color that is a complementary color to the color of the light of the wavelength to which said photosensitive materials contained in said pressure-rupturable capsules are photosensitive.

The method for the formation of images of this invention comprises placing the above-mentioned photosensitive sheet on a sheet-exposure stand; exposing said photosensitive sheet to light from or through a given image of the manuscript; placing said photosensitive sheet on an image-receiving sheet that is coated with developing materials so that said pressure-rupturable capsules of said photosensitive sheet can be brought into contact with said developing materials of said image-receiving sheet; and applying pressure to said two sheets. The light-reflective substance has specific spectral reflectivity properties that correspond to the wavelengths of light to which any one of the photosensitive materials is photosensitive.

In a preferred embodiment, the photosensitive materials contained in said pressure-rupturable capsules are photosensitive to different wavelengths of light.

In a preferred embodiment, each of the chromogenic materials contained in said pressure-rupturable capsules Gives rise to a color that is a complementary color to the color of the light of the wavelength to which said photosensitive materials contained in said pressure-rupturable capsules are photosensitive.

Thus, the invention described herein makes possible the objectives of (1) providing a photosensitive sheet from which pressure-rupturable capsules of the photosensitive sheet are exposed to light reflected so that the hardening of the pressure-rupturable capsules can be effectively attained; (2) providing a method for the formation of images by which pressure-rupturable capsules of a photosensitive sheet are exposed to light reflected from the light-reflective substrate of a photosensitive sheet, there is no need to increase the size of the light source or to lengthen the exposure time; and (3) providing a method for the formation of images in which because there is no need for the use of a filter, a decrease in the amount of light needed for exposure can be prevented, resulting in a distinct color image with reproducibility.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1:
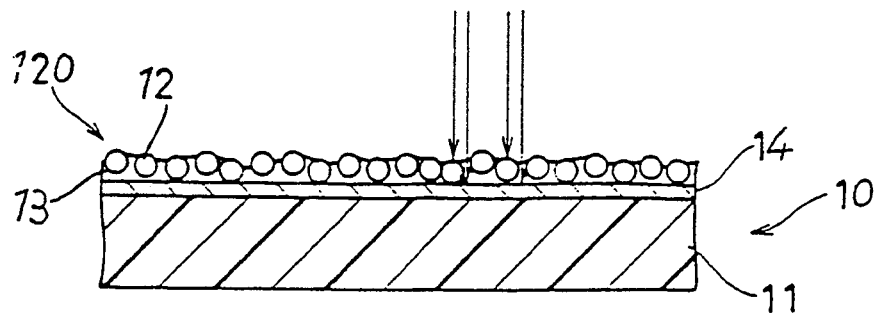
FIG. 1 is a sectional view showing a photosensitive sheet of this invention.

FIG. 1 shows a photosensitive sheet of this invention, which comprises a sheet-shaped substrate 11 with a thickness of about twelve micrometers to several dozens of micrometers (e.g., 25 $\mu$m) that is made of polyethylene terephthalate (PET), an aluminum layer 14 with a thickness of about 2 $\mu$m that is formed on the top surface of the substrate 11 by the well known vapor deposition method, and a microcapsule layer 120 that is formed by coating pressure-rupturable capsules 12 on the aluminum layer 14 by the use of a binder 13.

In the pressure-rupturable capsules 12, there are photosensitive materials (e.g., compounds having two or more ethylenically unsaturated terminal groups) that harden when illuminated by light, and chromogenic materials (e.g., colorless compounds having in its partial skeleton a lactone, a lactam, a sultone, a spiropyran, an ester, or an amino structure) that give rise to a specific color. The diameter of each of the capsules is about 5–6 $\mu$m.

When the photosensitive sheet 10 is illuminated with light that has reflected from a manuscript or light from laser devices, some of the light is directly absorbed by certain pressure-rupturable capsules 12, hardening the photosensitive materials contained in their insides, as shown in FIG. 1 by the arrows. The remaining light passes through the capsules 12 and the binder 13, and reaches the surface of the aluminum layer 14 by which the light undergoes diffused reflection or mirror-wise reflection and returns to the capsules 12, by which the light is absorbed, hardening the photosensitive materials contained in the capsules 12. In this way, the photo-sensitive materials that must be hardened by light are hardened both by light reflected from the manuscript and by light reflected from the aluminum layer 14, so the photosensitive materials are hardened without fail.

In this way, a latent image is formed on the photosensitive sheet 10 that corresponds to the image of the manuscript. Then, photosensitive sheet 10 on which this latent image has been formed is placed together with an image-receiving sheet and pressure is applied thereto. The image-receiving sheet is composed of a substrate in the shape of a sheet that is coated with developing materials. The developing materials are those conventionally employed in carbonless paper technology and are well known, examples of which are clay minerals such as acid clay, active clay; organic acid such as tannic acid; acid polymers such as phenolformaldehyde resins, etc. The developing materials of the said image-receiving sheet and the pressure-rupturable capsules 12 of the photosensitive sheet 10 are placed together so as to come into contact with each other, and pressed together. Accordingly, the non-hardened pressure-rupturable capsules 12 of the photosensitive sheet 10 rupture, and the chromogenic material contained inside of these pressure-rupturable capsules flows out. The said chromogenic material reacts with the developing materials of the image-receiving sheet, giving rise to color, and forming a particular image on the image-receiving sheet. In this way, the latent image that is formed on the photosensitive sheet 10 is developed, becoming visible, when brought together with the image-receiving sheet, and the image is transcribed onto the image-receiving sheet. The substrate of the image-receiving sheet need not be permeable to light; paper, resin, or the like can be used.

EXAMPLE 2

Figure 2:
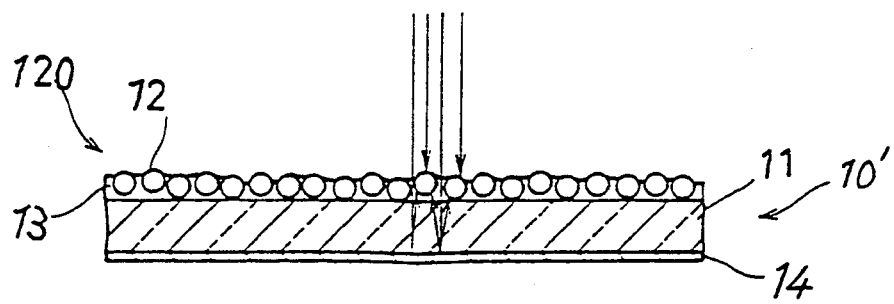
FIG. 2 is a sectional view showing another photosensitive sheet of this invention.

FIG. 2 shows another photosensitive sheet of this invention, which comprises a sheet-shaped light-permeable substrate 11 with a thickness of 15 $\mu$m that is made of PET, an aluminum layer 14 with a thickness of about 1 $\mu$m that is formed on the bottom surface of the substrate 11, and a microcapsule layer 120 that is formed by coating pressure-rupturable capsules 12 on the top surface of the substrate 11 by the use of a binder 13.

When the photosensitive sheet 10' is illuminated with light that has reflected from a manuscript or light from laser devices, some of the light is directly absorbed by certain pressure-rupturable capsules 12, hardening the photosensitive materials contained in their insides, as shown in FIG. 2 by the arrows. The remaining light passes through the capsules 12, the binder 13, and the substrate 11, and reaches the surface of the aluminum layer 14 by which the light undergoes diffused reflection or mirror-wise reflection and returns to the capsules 12, by which the light is absorbed, hardening the photosensitive materials contained in the capsules 12. In this way, the photosensitive materials that must be hardened by light are hardened both by light reflected from the manuscript and by light reflected from the aluminum layer 14, so the photosensitive materials are hardened without fail.

Although Examples 1 and 2 disclose an aluminum layer by which the substrate 11 becomes light-reflective, other metal vapor-deposition layers or white pigment-coated layers that are formed on the substrate can be employed.

EXAMPLE 3

Figure 3:
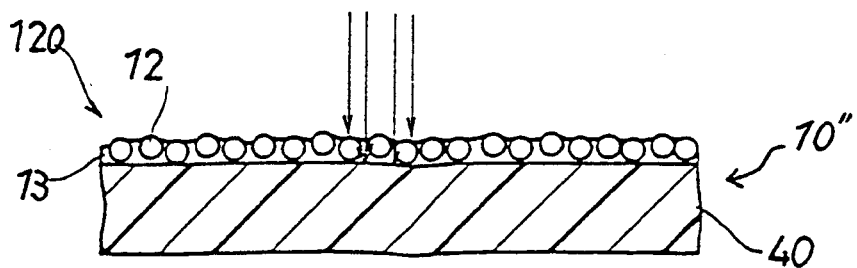
FIG. 3 is a sectional view showing another photosensitive sheet of this invention.

FIG. 3 shows another photosensitive sheet of this invention, which comprises a sheet-shaped substrate 40 with a thickness of 25 $\mu$m that is made of polyethylene film into which white pigment is dispersed, and a microcapsule layer 120 that is formed by coating pressure-rupturable capsules 12 on the top surface of the substrate 40 by the use of a binder 13. The white-colored substrate 40 is light-reflective.

When the photosensitive sheet 10" is illuminated with light that has reflected from a manuscript or light from laser devices, some of the light is absorbed by certain pressure-rupturable capsules 12, hardening the photosensitive materials contained in their insides, as shown in FIG. 3 by the arrows. The remaining light passes through the capsules 12 and the binder 13, and reaches the substrate 40 by which the light undergoes diffused reflection or mirror-wise reflection and returns to the capsules 12, by which the light is absorbed, hardening the photosensitive materials contained in the capsules 12. In this way, the photosensitive materials are hardened both by light reflected from the manuscript and by light reflected from the substrate 40, so the photosensitive materials are hardened without fail.

As mentioned above, the light that has passed through the microcapsule layer 120 or the microcapsule layer 120 and the substrate 11 undergoes diffused reflection or mirror-wise reflection by the aluminum layer 14 of the substrate 11 or the substrate 40 itself and returns to the capsules 12, by which the light is absorbed. Even when the light undergoes diffused reflection by the aluminum layer 14 or the substrate 40, pressure-rupturable capsules 12 that need not be light-hardened will not be hardened, because the said microcapsule layer 120 and the substrate 11 are thin and the amount of light that permeates therethrough is slight. The photosensitive materials contained in the capsules 12 are hardened both by light reflected from the manuscript and by light reflected from the aluminum layer 14 or the substrate 40, so that the hardening of the photosensitive materials can be accelerated.

Figure 4:
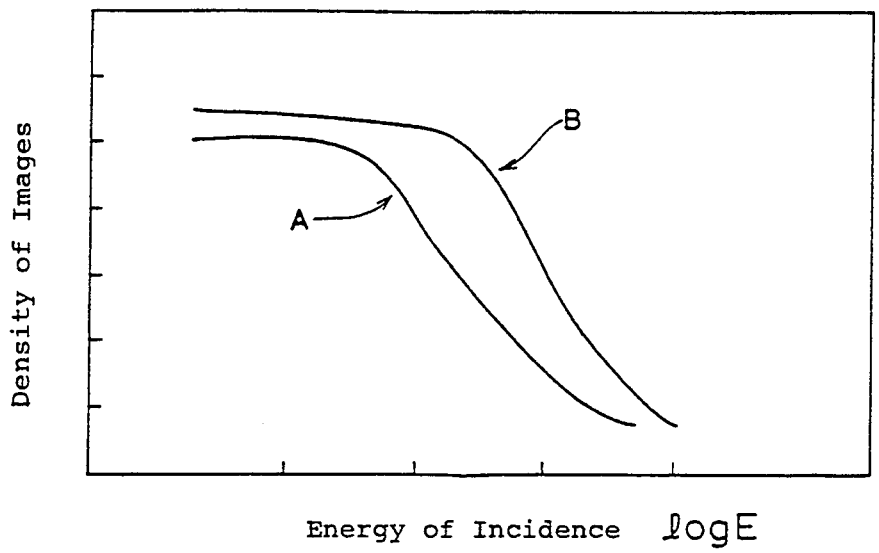
FIG. 4 is a graph showing the relationship between the image density and the energy of incidence with respect to a photosensitive sheet of this invention and a conventional photosensitive sheet.

FIG. 4 compares the density of the images with the use of the photosensitive sheet of Examples 2 and 3, A, and the use of a conventional photosensitive sheet, B, when the length of the time of illumination is the same, wherein the abscissa indicates the relative value of the energy of incidence and the ordinate indicates the density of the image. It can be seen from FIG. 4 that when the photosensitive sheet of this invention is used, the pressure-rupturable capsules of the specific areas that have been exposed to light are hardened without fail, which makes it possible to reproduce the image with faithfulness, whereas when the conventional photosensitive sheet is used, the density of the image becomes high, which makes it impossible to reproduce the image of the manuscript faithfully.

EXAMPLE 4

Figure 5:
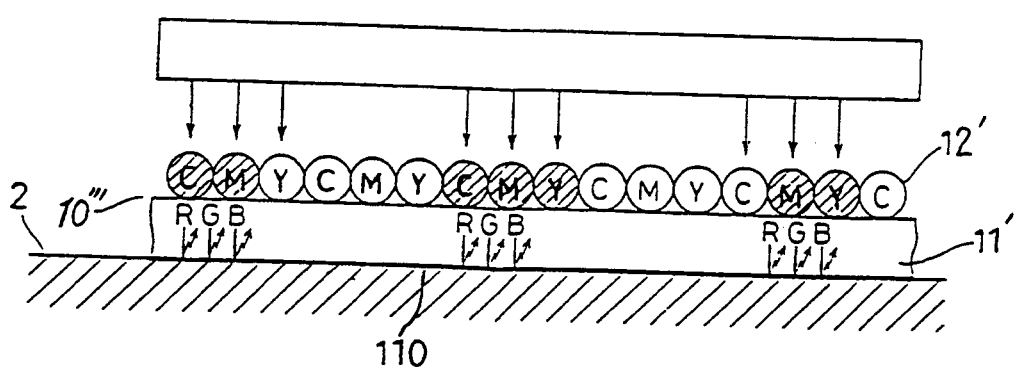
FIG. 5 is a diagram showing the exposure of another photosensitive sheet of this invention.

FIG. 5 shows a method for the formation of colored images by the use of a photosensitive sheet. The photosensitive sheet 10''' comprises a colorless, transparent substrate 11' in the shape of a sheet, three kinds of pressure-rupturable capsules 12' that are uniformly dispersed on the top surface of the substrate 11', and a resin layer 110 that is painted on the bottom surface of the substrate 11'.

The substrate 11' has a thickness of about twelve micrometers to several dozens of micrometers. The pressure-rupturable capsules 12' that coat the said substrate 11' include pressure-rupturable capsules Y that contain photosensitive materials that are hardened by light in the blue wavelength and a chromogenic material (a colorless pigment) that gives rise to yellow, which is the complementary color to blue; pressure-rupturable capsules M that contain photosensitive materials that are hardened by light in the green wavelength and a chromogenic material (a colorless pigment) that gives rise to magenta, which is the complementary color to green; and pressure-rupturable capsules C that contain photosensitive materials that are hardened by light in the red wavelength and a chromogenic material (a colorless pigment) that gives rise to cyan, which is the complementary color to red. The diameter of the individual pressure-rupturable capsules is 5–6 $\mu$m. The resin layer 110 (e.g., a PET layer) has specific spectral reflective properties that cause it to reflect all light except for red light, 90% of which is absorbed by the resin layer 110. When the photosensitive sheet 10''' is placed on a sheet-exposure stand 2 and white light is used to illuminate a manuscript (not shown), the light reflected from the manuscript illuminates the photosensitive sheet 10''', and most of the light that has been reflected from the manuscript to illuminate the photosensitive sheet 10''' is absorbed by the pressure-rupturable capsules 12' of the photosensitive sheet 10''', but some of the light passes through the light-permeable substrate 11' of the photosensitive sheet 10''', to be reflected from the resin layer 110, passing again through the substrate 11' to reach the pressure-rupturable capsules 12'. At this time, the resin layer 110 absorbs 90% of the red light of the total light that is incident upon the said resin layer 110, and reflects all of the rest of the light. Accordingly, as shown in FIG. 5, the green light (G) and the blue light (B) that reaches the resin layer 110 of the substrate 11' is not absorbed by the resin layer 110, but all of this light reaches the pressure-rupturable capsules 12', and is absorbed by the Y capsules and the M capsules, respectively. In contrast, the red light (R) that reaches the resin layer 110 of the substrate 11' is almost all absorbed by the resin layer 110, and only some of the red light (R) is reflected by the resin layer 110, to reach the pressure-rupturable capsules 12', and to be absorbed by the C capsules.

Figure 6:
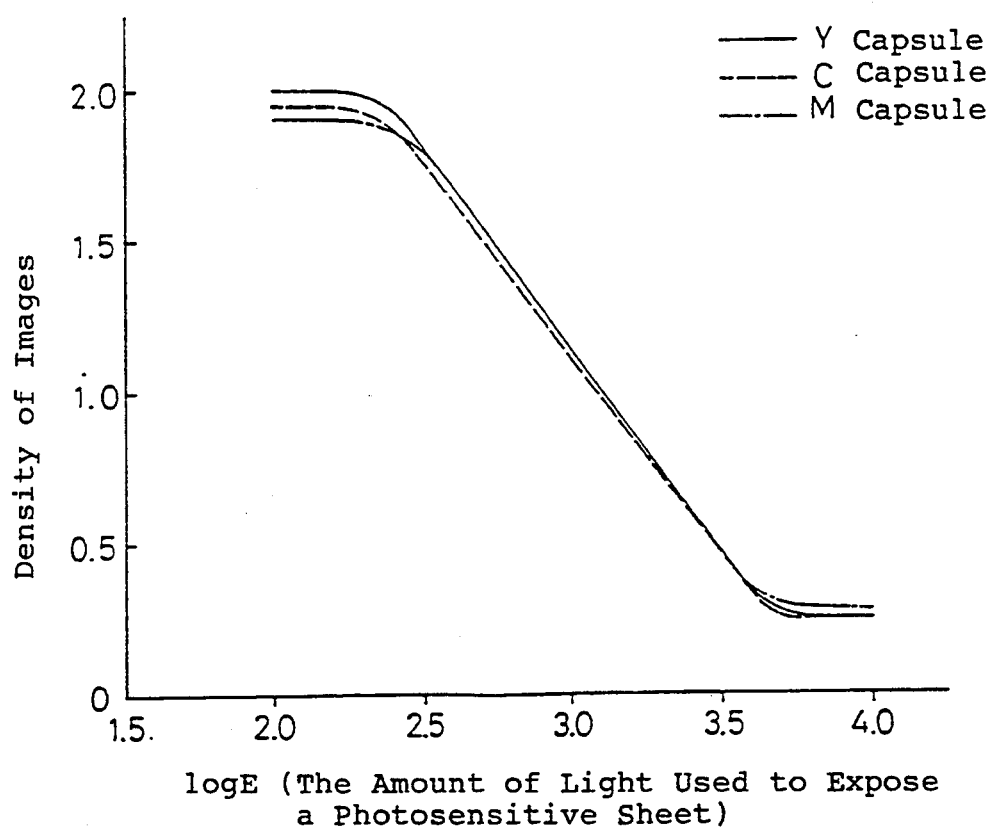
FIG. 6 is a graph showing the apparent photosensitivity characteristics of the pressure-rupturable capsules of the photosensitive sheet shown in FIG. 5.
Figure 7:
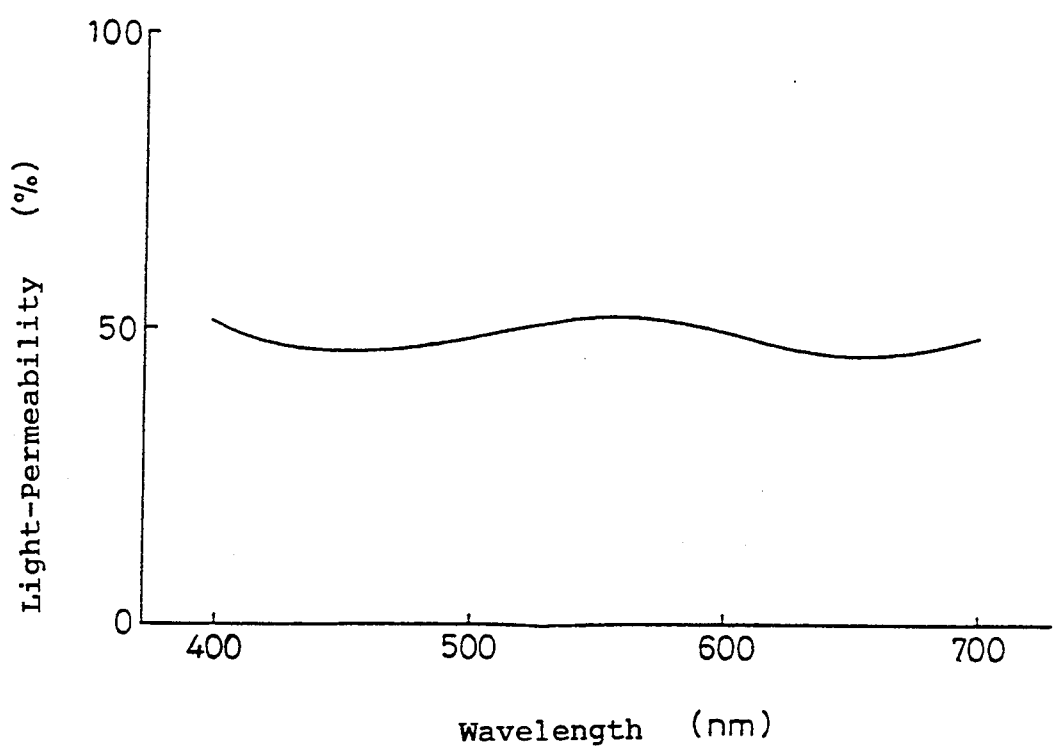
FIG. 7 is a graph showing the light-permeability characteristics of the substrate of the photosensitive sheet of FIG. 5.
Figure 9:
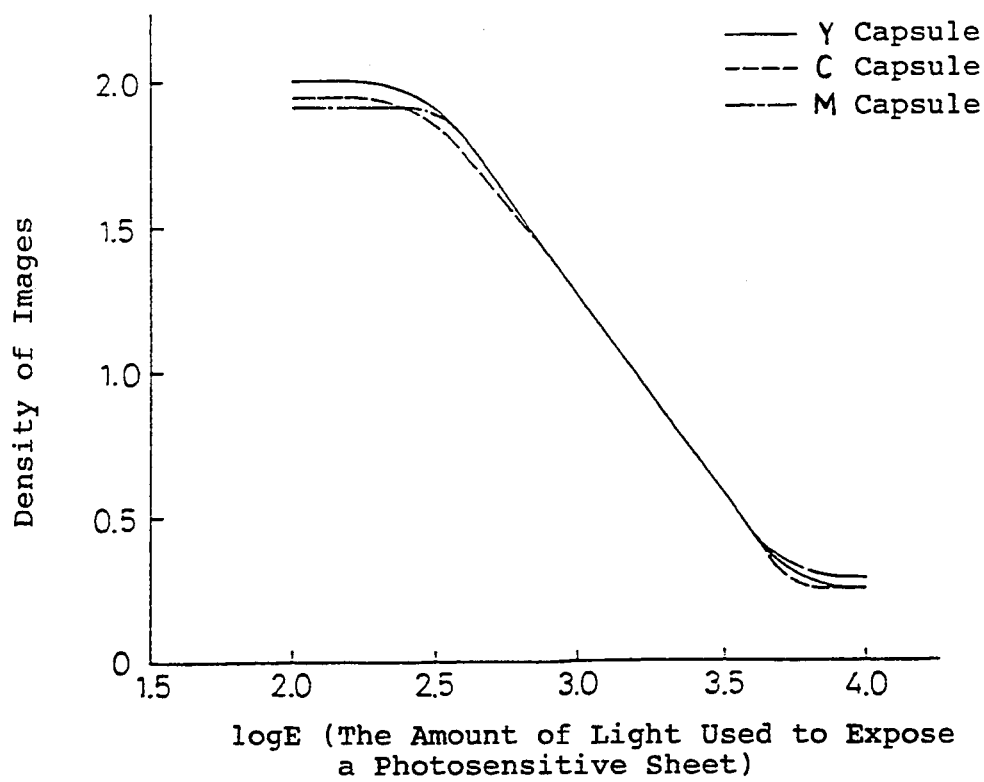
FIG. 9 is a graph showing the apparent sensitivity characteristics of the pressure-rupturable capsules used in a conventional method for the formation of images by the use of a filter.
Figure 10:
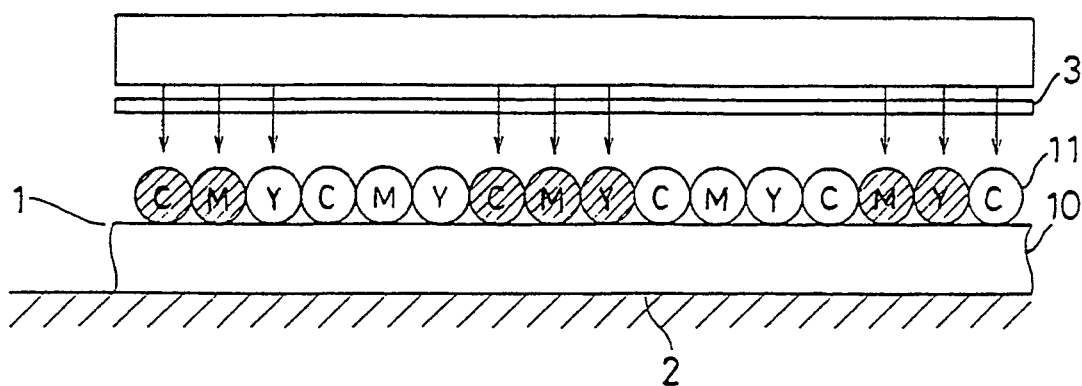
FIG. 10 is a diagram showing a conventional method for the formation of images.
Figure 11:
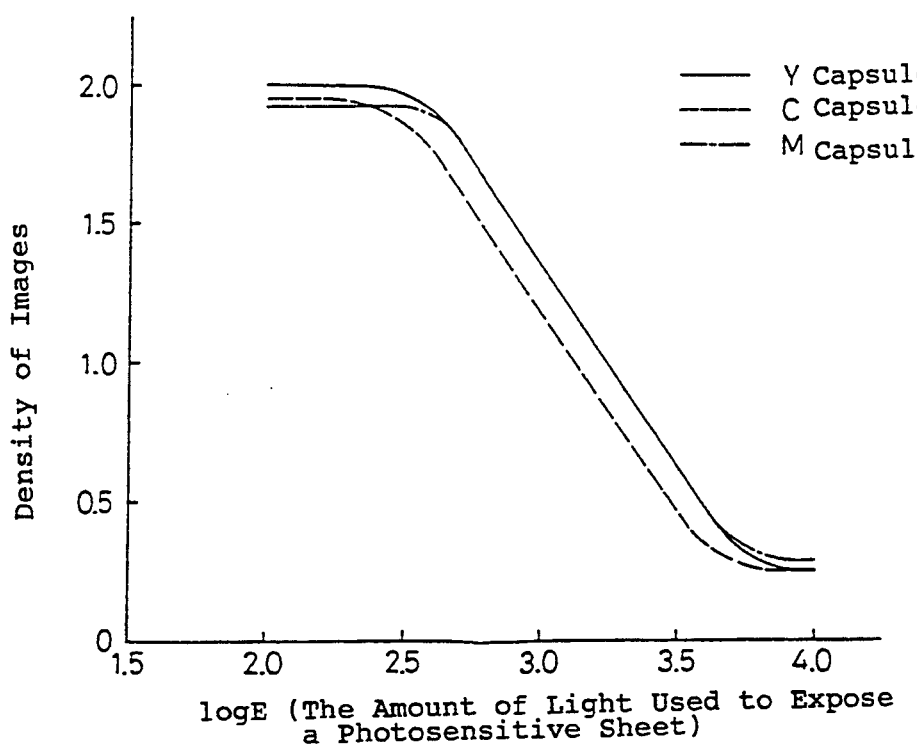
FIG. 11 is a graph showing the sensitivity of the pressure-rupturable capsules used in the conventional method for the formation of images.

The pressure-rupturable capsules 12' of the photosensitive sheet 10''' have the sensitivity properties shown in FIG. 11, and when an image is formed by the use of a photosensitive sheet 10''' coated with pressure-rupturable capsules 12' with these kinds of sensitivity characteristics, as shown in FIG. 6, the apparent sensitivity of the pressure-rupturable capsules 12' can be made to be almost the same as the apparent sensitivity of the pressure-rupturable capsules 12' when the photosensitive sheet is exposed to light with use of a conventional filter (see FIG. 9). Besides, in this case, compared to the situation in which a filter is used, the light that reaches the photosensitive sheet 10''' is almost 1.3 times as great. The spectral permeation characteristics of the light-permeable substrate 11' of the photosensitive sheet 10''' at this time are shown in FIG. 7. In this example, the resin layer 110 is made of a specific resin with spectral reflective properties such that 90% of red light is absorbed; this property changes with changes in the spectral permeation characteristics of the light-permeable substrate 11' of the photosensitive sheet 10''' (see FIG. 7) and the like, so it is preferable to find the optimum value by experiment.

Figure 8:
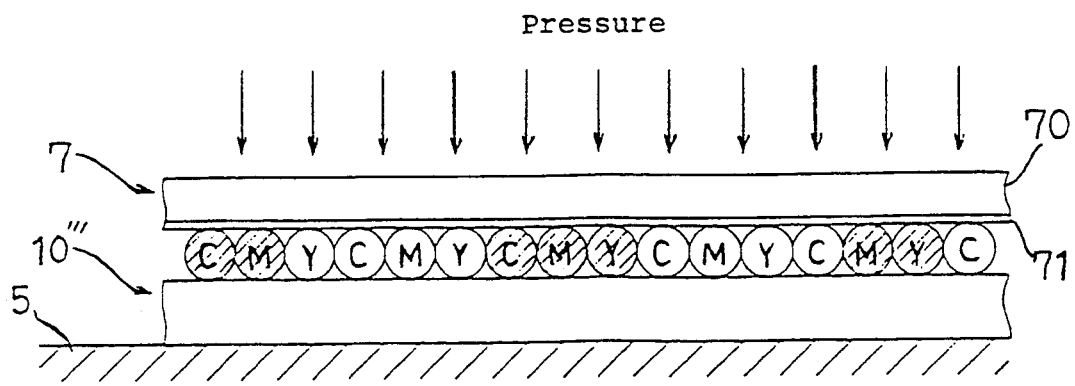
FIG. 8 is a diagram showing the process by which a latent image on the photosensitive sheet of FIG. 5 becomes visible.

In this way, the photosensitive sheet 10''' that has a latent image thereon with specific color information is brought together with an image-receiving sheet 7, as shown in FIG. 8, and the two are pressed together. The image-receiving sheet 7 is made of a substrate 70 in the form of a sheet that is coated with developing materials 71 that give rise to color when brought into contact with the chromogenic material of the pressure-rupturable capsules. The image-receiving sheet 7 is disposed on the photosensitive sheet 10''' in such a way that the developing materials 71 of the image-receiving sheet 7 and the pressure-rupturable capsules 12' of the photosensitive sheet 10''' are brought into contact, and then pressure is applied to the two, rupturing the pressure-rupturable capsules 12' that have not hardened, causing the chromogenic materials inside to flow out. This chromogenic material reacts with the developing materials 71, and each chromogenic material gives rise to a specific color, so that a colored image is formed on the image-receiving sheet 7 that corresponds to the colored image of the manuscript.

As described above, in this example, it is possible to calibrate the light-sensitivity of the pressure-rupturable capsules without the use of a filter, and compared to when a filter is used to adjust the amount of light used to expose the photosensitive sheet 10''', there is 1.3 times as much light, so there is no need to increase the size of the light source, or to increase the intensity of the light source by increasing the amount of electricity supplied. Moreover, when slit exposure is used, it is not necessary to increase the length of the exposure. The light that has once passed through the substrate of the photosensitive sheet is once more reflected by the resin layer of the photosensitive sheet, and can once more be used for exposure, so there is the merit of the efficient use of the light.

Although, in this example, in order to have the substrate have specific spectral reflective properties, the bottom surface of the substrate is coated with resin that has specific spectral reflective properties, the resin can be incorporated into the substrate, resulting in a substrate with specific spectral reflective properties.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A photosensitive sheet for recording a color image, consisting essentially of:
    a sheet-shaped substrate having first and second opposed surfaces, including on said second opposed surface at least one light-reflective surface to reflect light,
    said light-reflective surface absorbing at least one component of the red, green, and blue components of the exposed light, said light-reflective surface reflecting light different from said exposed light in at least one of said red, green, and blue light components, to compensate the sensitivities of three kinds of photosensitive materials to substantially the same extent; and
    a coating on said first opposed surface of said sheet-shaped substrate of three kinds of pressure-rupturable capsules, each of said three kinds of capsules containing one kind of colorless chromogenic material and one kind of photosensitive material,
    said photosensitive materials selected from the group consisting of photosensitive materials individually sensitive to red, green, and blue light, and said photosensitive materials adapted to harden when exposed to light passing directly through said pressure-rupturable capsules or reflected light from said light-reflective substrate surface through said pressure-rupturable capsules.

2. A photosensitive sheet according to claim 1, wherein said chromogenic substance contained in each pressure-rupturable capsules give rise to a color that is a complementary color of the light sensitive to each photosensitive materials contained in the capsule.

* * * * *